(12) United States Patent
Hopper et al.

(10) Patent No.: US 6,972,457 B1
(45) Date of Patent: Dec. 6, 2005

(54) IMAGING CELL THAT HAS A LONG INTEGRATION PERIOD AND METHOD OF OPERATING THE IMAGING CELL

(75) Inventors: Peter J. Hopper, San Jose, CA (US); Philipp Lindorfer, San Jose, CA (US); Vladislav Vashchenko, Palo Alto, CA (US); Robert Drury, Santa Clara, CA (US)

(73) Assignee: Eastman Kodak Company, Rochester, NY (US)

(*) Notice: Subject to any disclaimer, the term of this patent is extended or adjusted under 35 U.S.C. 154(b) by 0 days.

(21) Appl. No.: 10/821,286

(22) Filed: Apr. 9, 2004

(51) Int. Cl.[7] .................. H01L 29/788; H01L 29/76
(52) U.S. Cl. ............................... 257/318; 257/314
(58) Field of Search ........................... 257/314–324

(56) References Cited

U.S. PATENT DOCUMENTS

| | | | |
|---|---|---|---|
| 5,710,446 A | 1/1998 | Chi et al. .................. 257/225 |
| 5,761,126 A | 6/1998 | Chi et al. ............... 365/185.27 |
| 5,932,873 A | 8/1999 | Bergemont et al. ...... 250/208.1 |
| 5,962,844 A | 10/1999 | Merrill et al. ........... 250/214 A |
| 5,965,875 A | 10/1999 | Merrill ......................... 250/226 |
| 5,970,316 A | 10/1999 | Merrill ........................... 438/57 |
| 5,982,012 A | 11/1999 | Merrill ......................... 257/463 |
| 6,002,432 A | 12/1999 | Merrill et al. ............... 348/241 |
| 6,018,365 A | 1/2000 | Merrill ......................... 348/302 |
| 6,066,510 A | 5/2000 | Merrill ........................... 438/57 |
| 6,088,058 A | 7/2000 | Mead et al. ................. 348/296 |
| 6,150,683 A | 11/2000 | Merrill et al. ............... 257/292 |
| 6,160,282 A | 12/2000 | Merrill ......................... 257/292 |
| 6,211,510 B1 | 4/2001 | Merrill et al. ............ 250/208.1 |
| 6,246,043 B1 | 6/2001 | Merrill ...................... 250/208.1 |
| 6,369,853 B1 | 4/2002 | Merrill et al. ............... 348/302 |
| 6,410,899 B1 | 6/2002 | Merrill et al. ............ 250/208.1 |
| 6,452,633 B1 | 9/2002 | Merrill et al. ............... 348/302 |
| 6,476,372 B2 | 11/2002 | Merrill et al. ............ 250/208.1 |
| 6,512,544 B1 | 1/2003 | Merrill et al. ............... 348/302 |
| 6,525,304 B1 | 2/2003 | Merrill et al. ............ 250/208.1 |
| 6,606,120 B1 | 8/2003 | Merrill et al. ............... 348/273 |
| 6,632,701 B2 | 10/2003 | Merrill ........................... 438/70 |
| 6,636,261 B1 | 10/2003 | Pritchard et al. ........... 348/308 |
| 6,697,114 B1 | 2/2004 | Merrill ......................... 348/308 |
| RE38,499 E | 4/2004 | Merrill et al. ............... 348/301 |
| 6,727,521 B2 | 4/2004 | Merrill ........................... 257/98 |
| 6,731,397 B1 | 5/2004 | Merrill et al. ............. 358/1.16 |
| 6,741,283 B1 | 5/2004 | Merrill et al. ............... 348/308 |
| 6,760,070 B1 | 7/2004 | Merrill et al. ............... 348/294 |
| 6,841,824 B2 * | 1/2005 | Shum ........................... 257/314 |

* cited by examiner

Primary Examiner—Cuong Nguyen
(74) Attorney, Agent, or Firm—Peyton C. Watkins (57) ABSTRACT

The integration period of an imaging cell, or the time that an imaging cell is exposed to light energy, is substantially increased by utilizing a single-poly, electrically-programmable, read-only-memory (EPROM) structure to capture the light energy. Photogenerated electrons are formed in the channel region of the EPROM structure from the light energy. The photogenerated electrons are then accelerated into having ionizing collisions which, in turn, leads to electrons being injected onto the floating gate of the EPROM structure at a rate that is proportionate to the number of photons captured by the channel region.

9 Claims, 5 Drawing Sheets

IMAGING CELL THAT HAS A LONG INTEGRATION PERIOD AND METHOD OF OPERATING THE IMAGING CELL

BACKGROUND OF THE INVENTION

1. Field of the Invention

The present invention relates to imaging cells and, more particularly, to an imaging cell that has a long integration period and a method of operating the imaging cell.

2. Description of the Related Art

Traditional film-based cameras are rapidly being replaced by digital cameras that utilize a large number of imaging cells to convert the light energy received from an image into electric signals that represent the image. One type of imaging cell that is used in digital cameras to capture the light energy from an image is an active pixel sensor cell.

Figure 1:
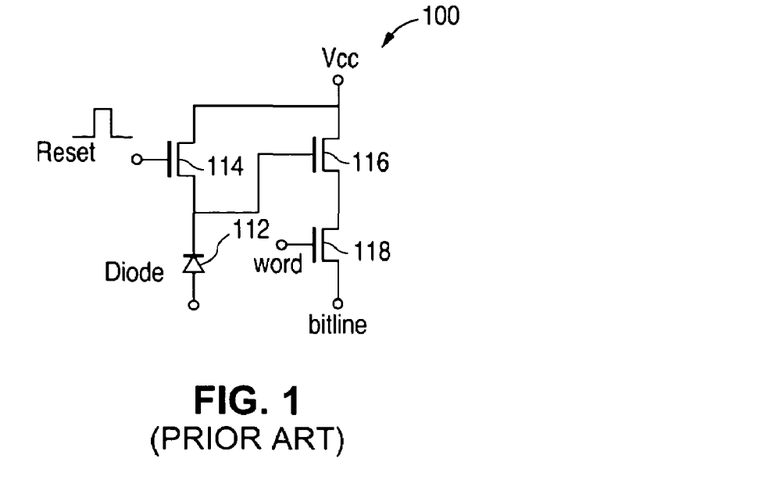
FIG. 1 is a schematic diagram illustrating a prior-art active pixel sensor cell 100.

FIG. 1 shows a schematic diagram that illustrates a prior-art active pixel sensor cell 100. As shown in FIG. 1, cell 100 includes a photodiode 112, an n-channel reset transistor 114, whose source is connected to photodiode 112, an n-channel sense transistor 116, whose gate is connected photodiode 112, and an n-channel row select transistor 118, whose drain is connected in series to the source of sense transistor 116.

The operation of active pixel sensor cell 100 is performed in three steps: a reset step, where cell 100 is reset from the previous integration cycle; an image integration step, where the light energy is collected and converted into an electrical signal; and a signal readout step, where the signal is read out.

As shown in FIG. 1, during the reset step, the gate of reset transistor 114 is briefly pulsed with a reset voltage, such as 5 volts, which resets photodiode 112 to an initial integration voltage which is equal to $V_R - V_T$, where $V_R$ represents the reset voltage, and $V_T$ represents the threshold voltage of reset transistor 114.

During integration, light energy, in the form of photons, strikes photodiode 112, thereby creating a number of electron-hole pairs. Photodiode 112 is designed to limit recombination between the newly formed electron-hole pairs. As a result, the photogenerated holes are attracted to the ground terminal of photodiode 112, while the photogenerated electrons are attracted to the positive terminal of photodiode 112 where each additional electron reduces the voltage on photodiode 112.

At the end of the integration period, the final voltage on photodiode 112 is equal to $V_R - V_T - V_S$, where $V_S$ represents the change in voltage due to the absorbed photons. Thus, the number of photons which were absorbed by photodiode 112 during the image integration period can be determined by subtracting the voltage at the end of the integration period from the voltage at the beginning of the integration period, thereby yielding the value $V_S$, i.e., $((V_R - V_T) - (V_R - V_T - V_S))$.

Following the image integration period, active pixel sensor cell 100 is read out by turning on row select transistor 118 (which has been turned off until this point). When row select transistor 118 is turned on, the reduced voltage on photodiode 112 reduces the voltage on the gate of sense transistor 116 which, in turn, reduces the magnitude of the current flowing through transistors 116 and 118. The reduced current level is then detected by conventional current detectors.

One drawback of active pixel sensor cells is that active pixel sensor cells typically operate poorly under low light conditions. With conventional film-based cameras, the amount of time that the shutter is open (the f stop) can be adjusted from, for example, one thousandth of a second to capture an image of an object in motion, up to several seconds to capture an image of an object under very low light conditions, such as at night.

With an active pixel sensor cell, however, the maximum time that a cell can be exposed to light energy is in the order of milliseconds. This is because a leakage current in the photodiode, known as a dark current, can pull the initial integration voltage down to ground in approximately this period of time. The leakage current is known as a dark current because the leakage current can pull the initial integration voltage down to ground when no light energy at all is present.

Thus, when an active pixel sensor cell is exposed to the light energy from an image during an integration period, the initial integration voltage falls in response to both the received light energy as well as the dark current. When the integration period is relatively short, the dark current erroneously reduces the final integration voltage by only a small amount.

However, when the integration period is relatively long, such as milliseconds, the received light energy from the image is effectively lost because the dark current has sufficient time to pull the voltage on the photodiode down to ground or near ground. Thus, since an active pixel sensor cell is limited to an integration period that is in the order of milliseconds, active pixel sensor cells can not collect light energy for a long period of time and, therefore, are less than optimum when operating in low light conditions.

As a result, there is a need for an imaging cell that has a longer integration period which, in turn, allows light energy to be captured by the cell under low light conditions. Similarly, and based on the same reasoning, there is a need to reduce the size of a diode that is exposed to light for reasons of cost and yield. A smaller diode that is more sensitive can perform as well as a larger diode that is less sensitive.

DETAILED DESCRIPTION OF THE INVENTION

Figure 2A:
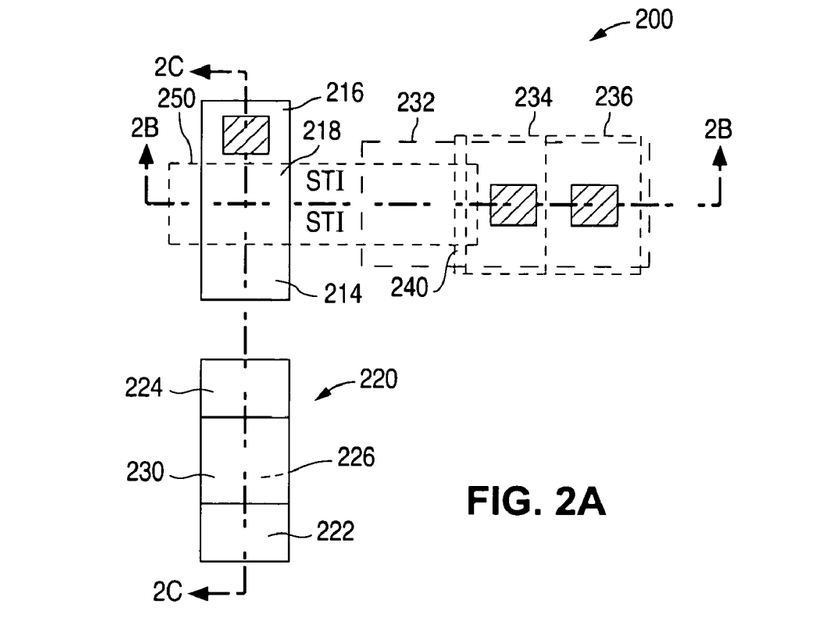
FIGS. 2A–2C are a series of views illustrating an example of an imaging cell 200 in accordance with the present invention.
Figure 2B:
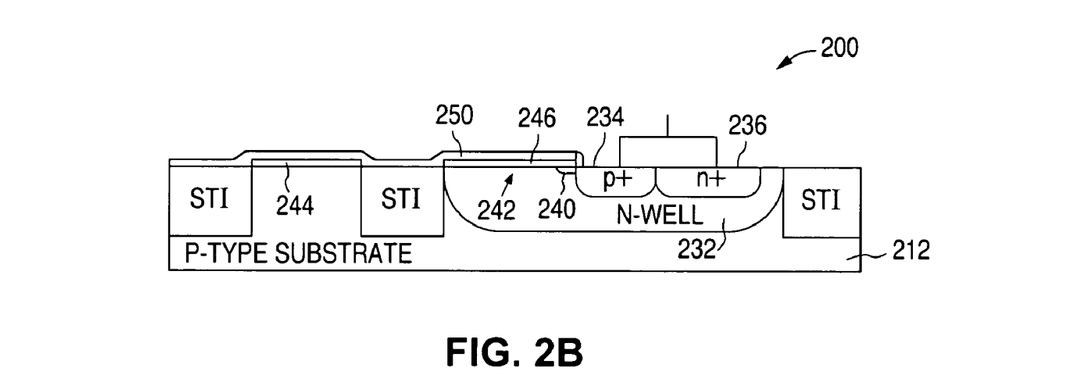
Figure 2C:
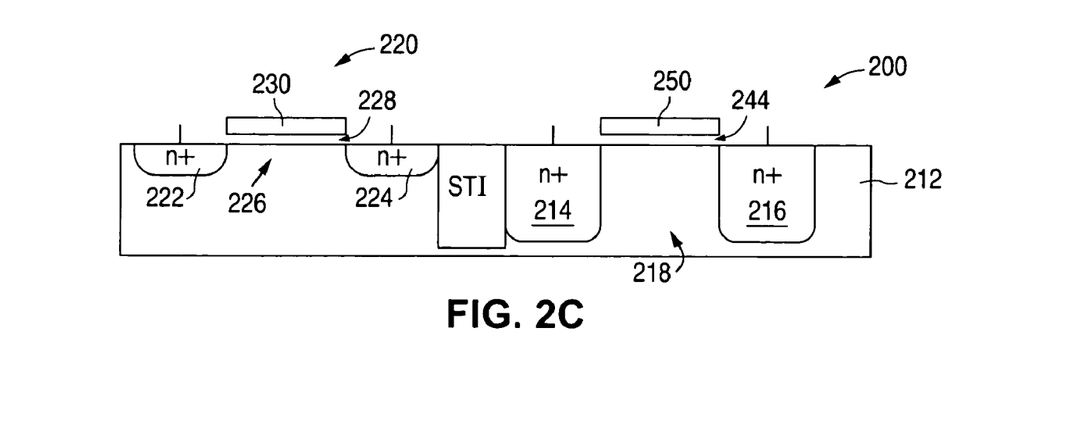

FIGS. 2A–2C show a series of views that illustrate an imaging cell 200 in accordance with the present invention. FIG. 2A shows a plan view of imaging cell 200, FIG. 2B shows a cross-sectional view taken along line 2B—2B of FIG. 2A, while FIG. 2C shows a cross-sectional view taken along line 2C—2C of FIG. 2A.

Imaging cell 200 represents an example of an imaging cell of the present invention. As described in greater detail below, the imaging cell of the present invention provides a substantially increased integration period, when compared to active pixel sensor cell 100, by utilizing a single-poly, electrically-programmable, read-only-memory (EPROM) structure to capture the light energy.

As shown in FIGS. 2A–2C, imaging cell 200 includes spaced-apart n+ source and drain regions 214 and 216, respectively, which are formed in a p− semiconductor material 212, such as a well or a substrate, and a channel region 218 which is defined between source and drain regions 214 and 216.

Source and drain regions 214 and 216 can have a number of depths. For example, source and drain regions 214 and 216 can have a depth of one micron, or the depth of the source and drain regions of the adjacent MOS transistors, such as 0.15 microns in a 0.18-micron fabrication process. A depth of one micron is sufficient to capture blue, green, and red photons.

FIGS. 2A and 2C illustrate an example of differing depths, where source and drain regions 214 and 216 have a depth of approximately one micron and an adjacent MOS transistor 220 has spaced-apart n+ source and drain regions 222 and 224, respectively, which are formed in p-semiconductor material 212 to a depth of, for example, 0.15 microns.

In addition, MOS transistor 220 has a channel region 226 that is defined between source and drain regions 222 and 224, a layer of gate oxide 228 that is formed on material 212, and a gate 230 that is formed on gate oxide layer 228 over channel region 226. Thus, as shown in FIG. 2C, the depths of source and drain regions 222 and 224 are substantially shallower than the depths of source and drain regions 214 and 216.

Although FIGS. 2A and 2C show source and drain regions 214 and 216 as being substantially deeper (to collect blue, green, and red photons), source and drain regions 214 and 216, and source and drain regions 222 and 224 can also have the same depths. An advantage of a shallow depth is that a shallow depth acts as a filter and limits the photons that can be collected to primarily blue and blue green photons.

Another advantage for applications that utilize the blue and blue green range of colors is that the present invention can be incorporated into a standard CMOS process with no additional masking steps. (Additional masking steps are required to form source and drain regions that are one micron deep.)

Referring again to FIGS. 2A–2C, imaging cell 200 also includes a control gate n-well 232 which is formed in p-type material 212, and a shallow trench isolation region STI which is formed in p-type material 212 to isolate source region 214, drain region 216, and channel region 218 from n-well 232.

In addition, cell 200 further includes adjoining p+ and n+contact regions 234 and 236, respectively, which are formed in n-well 232. Cell 200 also includes a p-type lightly-doped-drain (PLDD) region 240 which adjoins p+contact region 234. Further, a control gate region 242 is defined between PLDD region 240 and the shallow trench isolation region STI (that adjoins the surface and isolates n-well 232 from source region 214, drain region 216, and channel region 218).

In addition, a layer of gate oxide 244 is formed over channel region 218, a layer of control gate oxide 246 is formed over control gate region 242, and a floating gate 250 is formed over gate oxide layer 244, control gate oxide layer 246, and a portion of the shallow trench isolation region STI. Floating gate 250, which is a conductive region that is electrically isolated from all other conductive regions, can be formed from a layer of patterned polysilicon approximately 2,000 Å thick.

Gate oxide layer 244 and control gate oxide layer 246 can have a number of depths or thicknesses. In one embodiment, layers 244 and 246 have the depths of a standard flash, EPROM, or EEPROM device, such as, for example, 75 Å. When oxide layers 244 and 246 have standard flash, EPROM, or EEPROM device thicknesses (60 Å–90 Å), floating gate 250 can store a number of electrons for a long period of time, for more than six months, on the order of years.

In another embodiment, oxide layers 244 and 246 have depths that are substantially less than the depth of a standard flash, EPROM, or EEPROM device, such as, for example, 30 Å. In this case, floating gate 250 can store a number of electrons for only a relatively short period of time, on the order of a few seconds, such as greater than zero and less than three seconds. This, thinner oxide provides for simpler integration schemes, where the reset transistor and cell select transistors may be scaled down in size and leakage on the basis of a common gate oxide thickness, all over the cell and the array.

The operation of imaging cell 200 is performed in several steps that include: an erase step, where cell 200 is reset from a previous integration cycle; an image integration step, where the light energy is collected and converted into a stored electrical charge; and a signal readout step, where the charge level is read out.

Figure 3A:
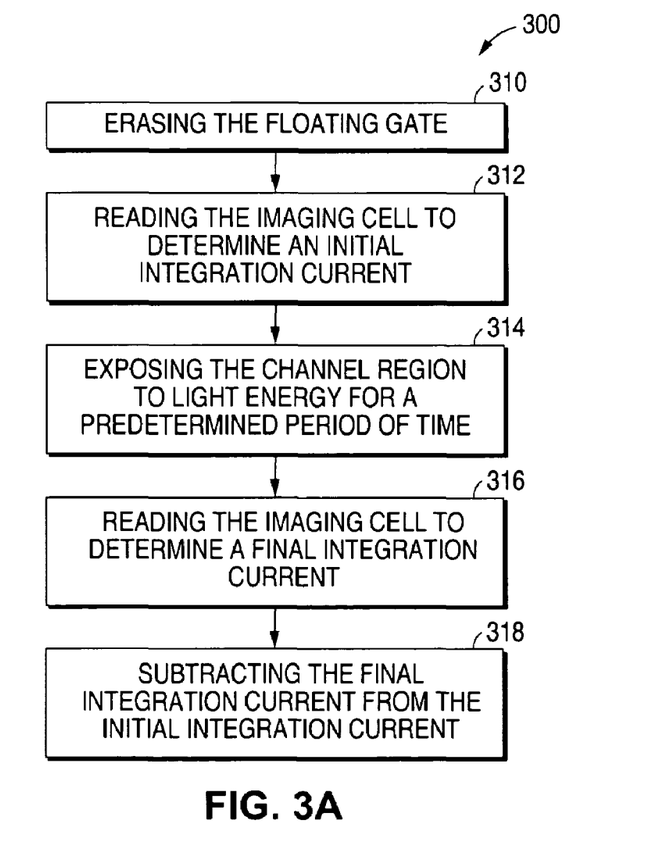
FIGS. 3A–3B are flow charts illustrating examples of methods 300 and 350, respectively, of operating an imaging cell in accordance with the present invention.
Figure 3B:
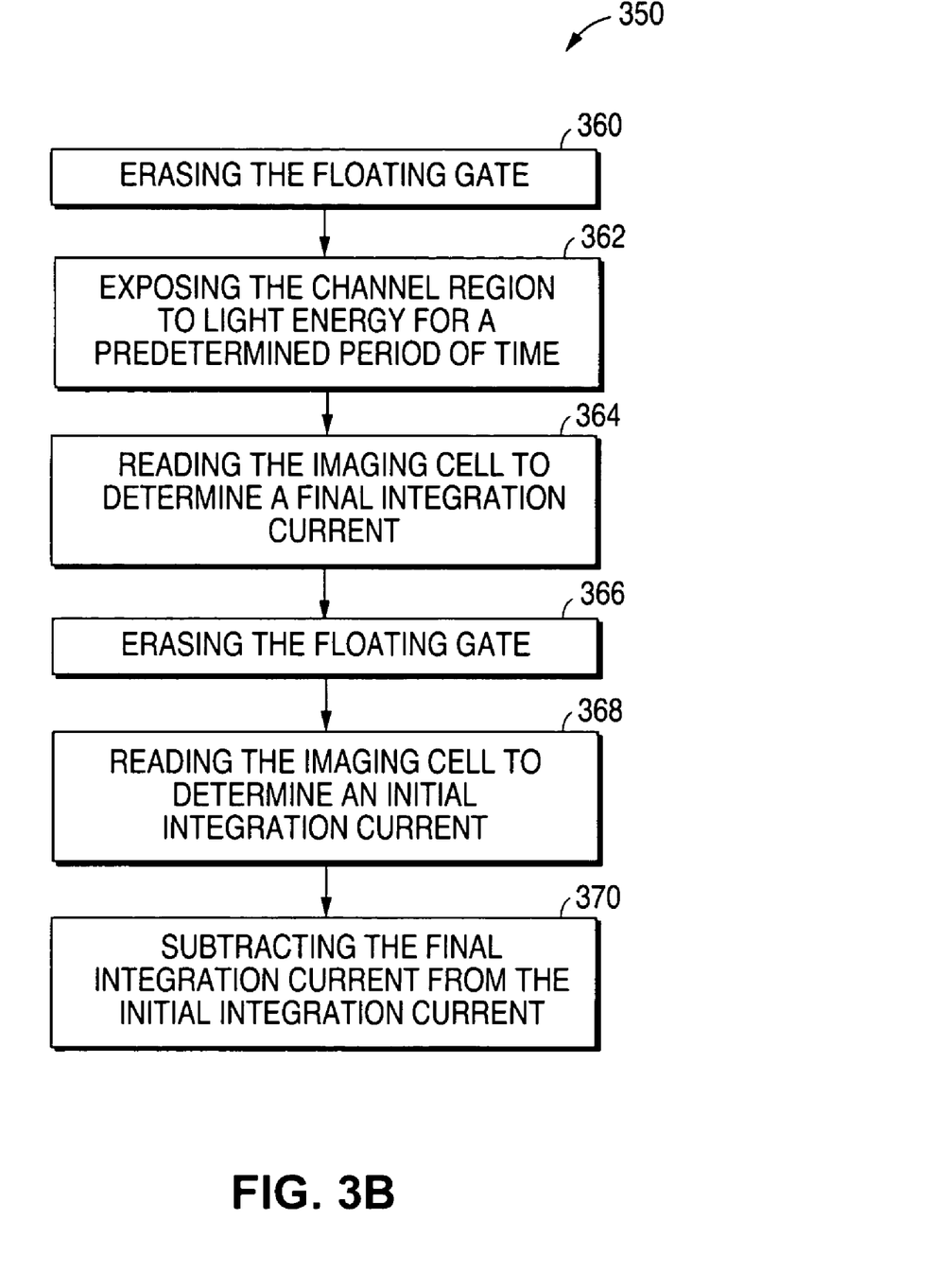

FIGS. 3A–3B are flow charts that illustrate examples of methods 300 and 350, respectively, of operating an imaging cell in accordance with the present invention. As shown in FIG. 3A, method 300 begins at step 310 by erasing the floating gate, such as floating gate 250. During erase step 310, while source and drain regions 214 and 216 and material 212 are held at ground, a positive erase voltage can be applied to control gate region 242 via n-well 232 and n+contact 236 that is sufficient to cause electrons which are stored on floating gate 250 to tunnel through to n-well 232 via the well-known Fowler-Nordheim tunneling process.

Alternately, floating gate 250 can be erased by irradiating cell 200 with ultraviolet (UV) light for a period of time. The UV light increases the energy of the electrons stored on floating gate 250 which, in turn, gives the electrons sufficient energy to penetrate the surrounding layers of oxide. Further, the erase step may not be needed when cell 200 can only store a charge for a relatively short period of time as floating gate 250 is effectively self erasable.

After cell 200 has been erased, method 300 moves to step 312 where image integration begins by first reading the imaging cell, such as cell 200, to determine an initial integration current. The initial integration current can be read from cell 200 by grounding material 212 and source region 214, placing a positive voltage on drain region 216, and a positive voltage on n-well 232 via n+ region 236.

The magnitude of the current that flows through cell 200 (from drain region 216 to source region 214) under these conditions is a function of the number of electrons that are present on floating gate 250, and represents the maximum current as ideally no electrons are present. The magnitude of the current is detected by conventional current detectors, and stored in a non-volatile or volatile memory. The initial integration current represents a reset condition where cell 200 is ready to be exposed to a new image.

P+ region 234 and PLDD region 240 increase the magnitude of the positive voltage that is capacitively coupled to floating gate 250 from n-well 232. When a positive voltage is applied to contacts 234 and 236, a positive potential is induced on floating gate 250. Specifically, the positive voltage applied to n+ contact region 236 in conjunction with the potential of floating gate 250 forms a deep depletion region at the surface of control gate region 242 which, in turn, reduces the potential at the surface of control gate region 242.

The positive voltage applied to p+ contact region 234 slightly forward-biases the p+ contact region to n-well junction at the surface. As a result, holes are injected into the surface region of control gate region 242, thereby inverting the surface of control gate region 242. The injected holes quickly reduce the depth of the depletion region at the surface of control gate region 242 which, in turn, places substantially all of the voltage applied to n+ contact region 236 across control gate oxide layer 246. As a result, the initial potential induced on floating gate 250 is defined by the voltage applied to contact regions 234 and 236, and the thickness of control gate oxide layer 246 (which defines the coupling ratio between n-well 232 and floating gate 250).

Without the presence of p+ contact region 234, few holes would accumulate at the surface of control gate region 242 when the surface is initially depleted because n-well 232 contains relatively few holes. Thus, the depth of the depletion region can only be slowly reduced in size as thermally-generated holes drift up to the surface of control gate region 242.

Since the depth of the depletion region is initially large, the initial potential induced on floating gate 250 is substantially less because the voltage applied to contact 236 is placed across both control gate oxide layer 246 and a relatively large depletion region. Thus, p+ region 234 provides a method for quickly reducing the depth of the depletion region after the surface of control gate region 242 is depleted which, in turn, increases the potential initially induced on floating gate 250.

As noted above, cell 200 also uses PLDD region 240. The thickness of control gate oxide layer 246 at the edge of the layer which is adjacent to p+ contact region 234 is slightly thicker than the central portion of the layer. As a result, the depletion region formed at the edge is too small to sufficiently invert the surface which, in turn, limits the ability of p+ contact region 234 to inject holes into the surface of control gate region 242. Thus, cell 200 utilizes PLDD region 240 to form a hole injection region that adjoins the surface region of control gate region 242 away from the edge.

Returning again to FIG. 3A, once the initial integration current has been determined, method 300 moves to step 314 where the channel region, such as channel region 218, is exposed to light energy, in the form of photons, for a predetermined period of time (the integration period). The photons that strike channel region 218 create a number of electron-hole pairs in channel region 218. The positive voltage that is applied to drain region 216 sets up an electric field between source and drain regions 214 and 216 which then accelerates the photogenerated holes and electrons in channel 218.

The accelerated electrons have ionizing collisions that form "channel hot electrons". The positive potential that is applied to n-well 232 places a positive potential on floating gate 250. The positive potential attracts these channel hot electrons which, in turn, penetrate gate oxide layer 244 and begin accumulating on floating gate 250, thereby raising the threshold voltage of cell 200. Thus, as long as channel region 218 is exposed to light energy, electrons continue to accumulate on floating gate 250, and thereby raise the threshold voltage of cell 200.

In a standard flash, EPROM, or EEPROM device, the voltages on the drain and control gate (n-well) that are used during a read operation are insufficient to generate channel hot electrons. This is because the energy of the drain-to-source electric field can not sufficiently accelerate electrons in the channel into having a significant number of ionizing collisions.

In the present invention, however, the same voltages that are used during a read operation can be used during integration. This is because the electrons are photogenerated and thereby energetic. Thus, since the photogenerated electrons posses a photogenerated energy, less energy must be obtained from the drain-to-source electric field to initiate a necessary number of ionizing collisions. As a result, electrons can be injected onto floating gate 250 with lower drain 216 and control gate region 242 (via n-well 232 and n+ contact 236) voltages than are required to program a standard flash, EPROM, or EEPROM device.

In addition, because the photogenerated electron-hole pairs are formed in channel region 218, the voltage applied to control gate region 242 (via n-well 232 and contact 236) can be reduced, such as to a value that is at or near ground. In a standard flash, EPROM, or EEPROM device, a relatively large voltage must be placed on the control gate to attract electrons up to the surface to form a channel, even though a substantial number of electrons have already been injected onto the floating gate.

In the present invention, the relatively large control gate voltage is not required because the photogenerated electrons are already formed in channel region 218. Alternately, the voltage on control gate region 242 during integration can be greater than the voltage used during the read operation, and the voltage on drain region 216 during integration can be greater than the voltage on drain region 216 during the read operation.

Once the image integration period has ended, method 300 moves to step 316 where the imaging cell, such as cell 200, is again read to determine a final integration current. Like the initial integration current, the final integration current in cell 200 can be read by grounding material 212 and source region 214, placing a positive voltage on drain region 216, and a positive voltage on n-well 232 (via n+ contact 236).

The magnitude of the current that flows through cell 200 (from drain region 216 to source region 214), as detected by conventional current detectors, is a function of the number of photons that were collected during the image integration period since the electrons injected onto floating gate 250 increase the threshold voltage of cell 200. As a result, the more photons collected, the less current flows through cell 200.

Following this, method 300 moves to step 318 where the number of electrons that were injected onto the floating gate during an integration period can be determined by subtracting the final integration current from the initial integration current. The number of electrons present on the floating gate, such as floating gate 250, is related to the number of photons that struck the channel region, such as channel region 218, during the image integration period.

The post-integration read (step 316) can take place well after the image was captured when oxide layers 244 and 246 have thicknesses that are similar to the thicknesses of standard flash, EPROM, or EEPROM devices (and the initial integration current is stored in a non-volatile memory or a continuously powered volatile memory), or immediately afterwards if the thicknesses of oxide layers 244 and 246 are well less than the thicknesses of standard flash, EPROM, or EEPROM devices (and the initial integration current is stored in a volatile memory).

Alternately, an imaging cell can also be operated as described in method 350. As shown in FIG. 3B, method 350 begins at step 360 by erasing the floating gate, such as floating gate 250. Erase step 360 can be performed the same way as erase step 310. After this, method 350 moves to step 362 to expose the channel region to light energy for a predetermined period of time. Step 362 can be performed the same way as step 314.

Next, method 350 moves to step 364 to read the image cell to determine a final integration current. Step 364 can be performed the same way as step 316. Following this, method 350 moves to step 366 to again erase the floating gate. Step 366 can be performed the same way as step 360.

After the floating gate has been erased a second time, method 350 moves to step 368 to read the imaging cell to determine an initial integration current. Step 368 can be performed the same way as step 312. After this, method 350 moves to step 370 to subtract the final integration current from the initial integration current. Step 370 can be performed in the same way as step 318.

Thus, alternate method 350 differs from method 300 as to when the initial integration current is read. In method 300, the initial integration current is read at the beginning of the integration period. By contrast, in method 350, the initial integration current is read at the end of the integration period, after the final integration current has been read and the cell again reset.

Floating gate 250 has an unequal effect on the different wavelengths of light, attenuating blue photons more severely than red photons. For example, floating gate 250 may pass 50% of the blue photons, 60% of the green photons, and 70% of the red photons. Well known compensation circuitry can be used to adjust the resulting signal levels (the result of the subtraction) to correct for these differences.

One of the advantages of the present invention is that imaging cell 200 does not require a photodiode to collect photons. Thus, imaging cell 200 is not subject to the dark current that limits the image integration period of an imaging cell like cell 100. As a result, imaging cell 200 can be exposed to an image under low light conditions, such as at night, for long periods of time.

Figure 4A:
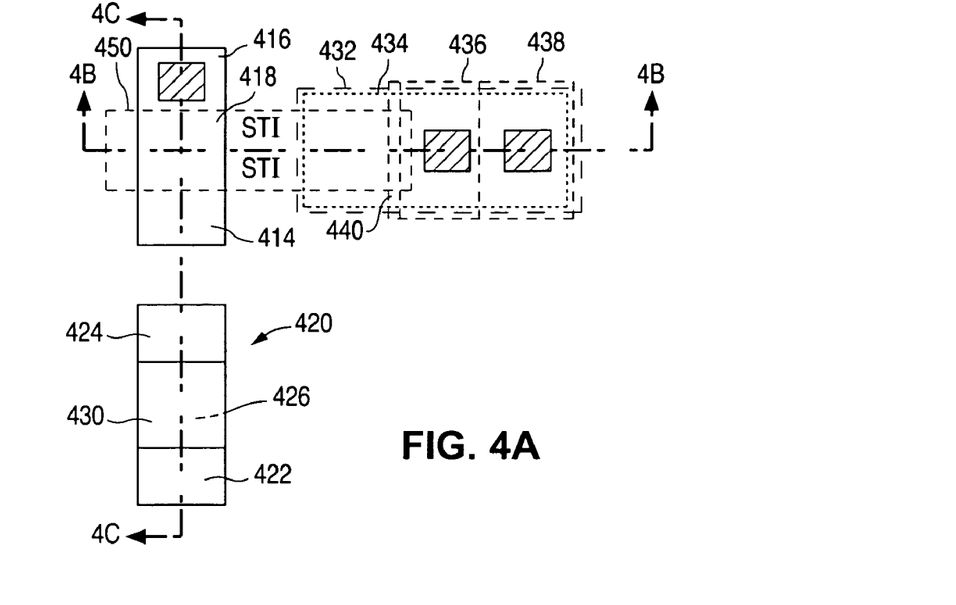
FIGS. 4A–4C are a series of views illustrating an imaging cell 400 in accordance with the present invention.
Figure 4B:
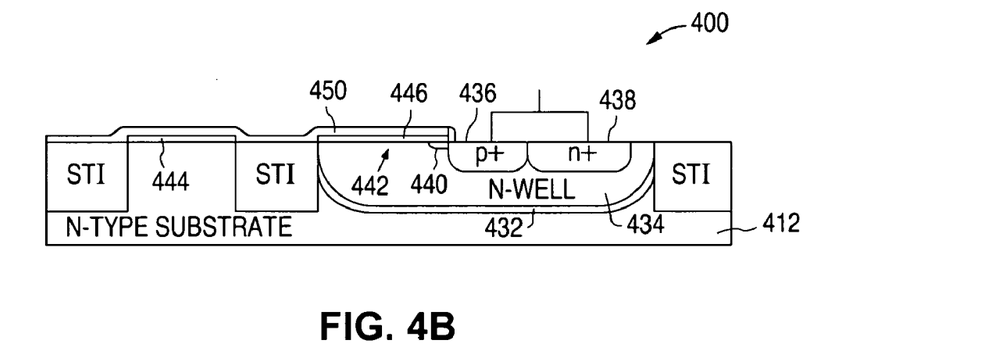
Figure 4C:
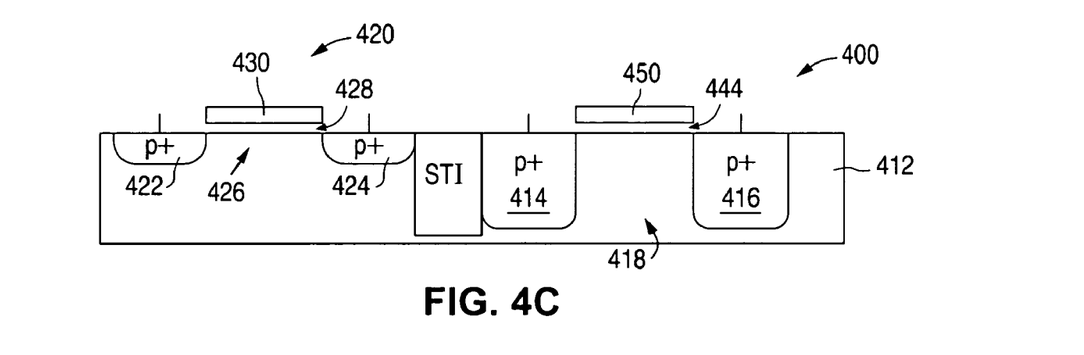

FIGS. 4A–4C show a series of views that illustrate an imaging cell 400 in accordance with the present invention. FIG. 4A shows a plan view of imaging cell 400, FIG. 4B shows a cross-sectional view taken along line 4B—4B of FIG. 4A, while FIG. 4C shows a cross-sectional view taken along line 4C—4C of FIG. 4A. Imaging cell 400 also represents an example of an imaging cell of the present invention.

As shown in FIGS. 4A–4C, imaging cell 400 includes spaced-apart p+ source and drain regions 414 and 416, respectively, which are formed in an n– semiconductor material 412, such as a well or a substrate, and a channel region 418 which is defined between p+ source and drain regions 414 and 416.

Source and drain regions 414 and 416 can have a number of depths. For example, source and drain regions 414 and 416 can have a depth of one micron, or the depth of the source and drain regions of the adjacent MOS transistors, such as 0.15 microns in a 0.18-micron fabrication process.

FIGS. 4A and 4C illustrate an example of differing depths, where source and drain regions 414 and 416 having a depth of approximately one micron and an adjacent MOS transistor 420 has spaced-apart p+ source and drain regions 422 and 424, respectively, which are formed in n– semiconductor material 412 to a depth of, for example, 0.15 microns.

In addition, MOS transistor 420 has a channel region 426 that is defined between source and drain regions 422 and 424, a layer of gate oxide 428 that is formed on material 412, and a gate 430 that is formed on gate oxide layer 428 over channel region 426. As shown in FIGS. 4A and 4C, the depths of source and drain regions 422 and 424 are substantially shallower than the depths of source and drain regions 414 and 416. (Source and drain regions 414 and 416 can alternately have the same depths as source and drain regions 422 and 424 in blue and blue-green light applications.)

Referring again to FIGS. 4A–4C, imaging cell 400 also includes a p-well 432 which is formed in n-type material 412, an n-well 434 which is formed in p-type well 432, and a shallow trench isolation region STI which is formed in n-type material 412 to isolate to isolate source region 414, drain region 416, and channel region 418 from p-well 432 and n-well 434. In addition, cell 400 further includes adjoining p+ and n+ contact regions 436 and 438, respectively, which are formed in n-well 434.

Cell 400 also includes a p-type lightly-doped-drain (PLDD) region 440 which adjoins p+ contact region 436. Further, a control gate region 442 is defined between PLDD region 440 and the shallow trench isolation region STI that isolates p-well 432 and n-well 434 from source region 414, drain region 416, and channel region 418.

In addition, a layer of gate oxide 444 is formed over channel region 418, a layer of control gate oxide 446 is formed over control gate region 442, and a floating gate 450 is formed over gate oxide layer 444, control gate oxide layer 446, and a portion of the shallow trench isolation region STI. Floating gate 450, which is a conductive region that is electrically isolated from all other conductive regions, can be formed from a layer of patterned polysilicon approximately 2,000 Å thick. As with layers 244 and 246, layers 444 and 446 can have a number of depths or thicknesses to vary the time electrons are retained on floating gate 450.

The operation of imaging cell 400 can be performed in the same manner as described with respect to methods 300 and 350. Imaging cell 400 can be erased via Fowler-Nordheim tunneling, exposure to UV light, or self erasing due to the thicknesses of the gate oxide layers 444 and 446. With Fowler-Nordheim tunneling, material 412, source and drain regions 414 and 416, and p-well 432 are held at ground, a positive erase voltage is applied to control gate region 442 via n-well 434 and n+ contact 438 that is sufficient to cause electrons which are stored on floating gate 450 to tunnel through to n-well 434.

After imaging cell 400 has been erased, image integration can read (as in method 300) to determine the initial integration current. The initial integration current can be read by grounding material 412, drain region 416, p-well 432, and n-well 434, and placing a positive voltage on source region 414.

The magnitude of the current that flows through cell 400 (from source region 414 to drain region 416) under these conditions is a function of the number of electrons that are present on floating gate 450, and represents the maximum current since ideally no electrons are present on floating gate 450. The magnitude of the current is detected by conventional current detectors, and stored in a non-volatile or volatile memory. The initial integration current represents a reset condition where cell 400 is ready to be exposed to a new image.

After the initial integration current has been read (as in method 300), or after cell 400 has been erased (as in method 350), channel region 418 can be exposed to light energy in the form of photons. The photons that strike channel region 418 create a number of electron-hole pairs in channel region 418. The positive voltage applied to source region 414 sets up an electric field between source and drain regions 414 and 416 which then accelerates the photogenerated holes and electrons in channel 418.

As above, the accelerated electrons have ionizing collisions that form "channel hot electrons" which, in turn, penetrate gate oxide layer 444 and begin accumulating on floating gate 450, thereby changing the threshold voltage of cell 400. Thus, as long as channel region 418 is exposed to light energy, electrons continue to accumulate on floating gate 450, and thereby change the threshold voltage of cell 400.

Once the image integration period has ended, cell 400 is read to determine a final integration current. Like the initial integration current, the final integration current can be read by grounding material 412, drain region 416, and p-well 432, and n-well 434, and placing a positive voltage on source region 416.

The magnitude of the current that flows through cell 400 (from source region 414 to drain region 416), which is detected by conventional current detectors, is a function of the number of photons that were collected during the image integration period since the electrons injected onto floating gate 450 change the threshold voltage of cell 400. As a result, the more photons that are collected, the less current flows through cell 400.

As a result, the number of electrons that were injected onto floating gate 450 during an integration period can be determined by subtracting the final integration current from the initial integration current. The number of electrons present on floating gate 450, in turn, is related to the number of photons that struck channel region 418 during the image integration period.

As above, the post-integration read can take place well after the image was captured when oxide layers 444 and 446 have thicknesses that are similar to the thicknesses of standard flash, EPROM, or EEPROM devices (and the initial integration current is stored in a non-volatile memory or a continuously powered volatile memory), or immediately afterwards if the thicknesses of oxide layers 444 and 446 are well less than the thicknesses of standard flash, EPROM, or EEPROM devices (and the initial integration current is stored in a volatile memory).

After the final integration current has been read, the final integration current can be subtracted from the initial integration current (as with method 300), or cell 400 can be erased and then read to determine the initial integration current (as with method 350). Once the initial integration current has been determined, the final integration current is then subtracted from the initial integration current.

Figure 5A:
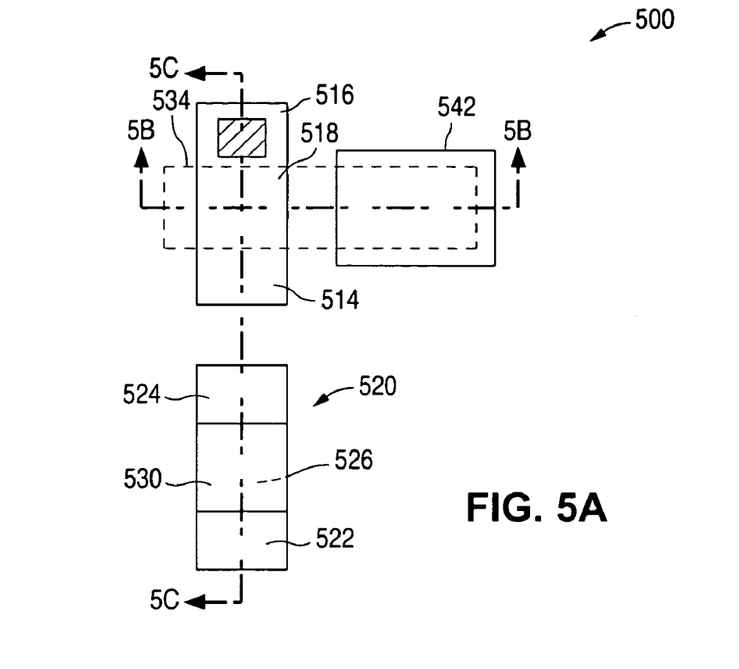
FIGS. 5A–5C are a series of views illustrating an imaging cell 500 in accordance with the present invention.
Figure 5B:
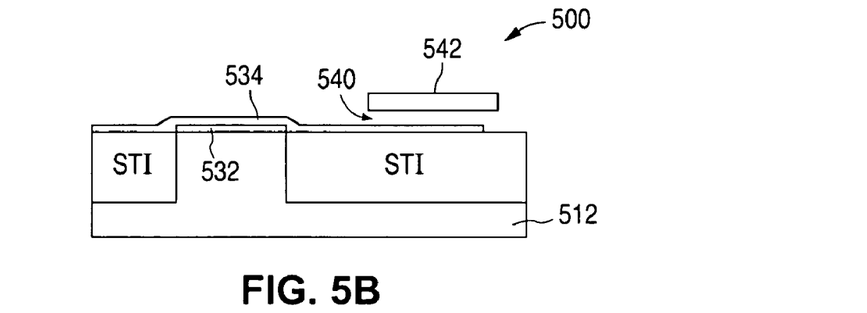
Figure 5C:
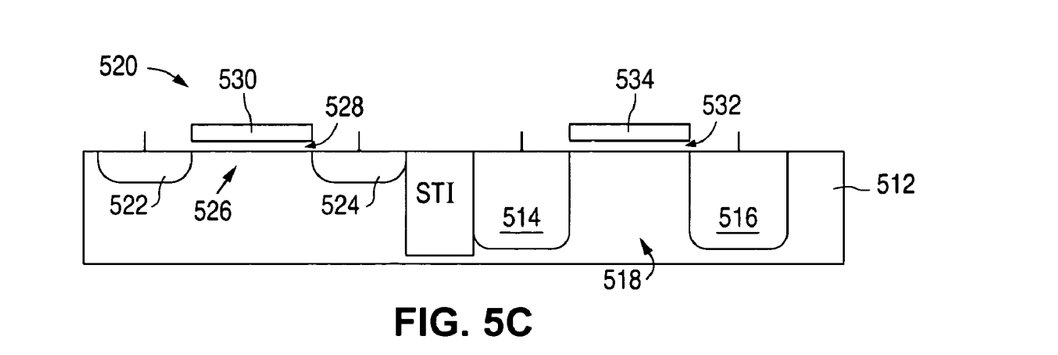

FIGS. 5A–5C show a series of views that illustrate an imaging cell 500 in accordance with the present invention. FIG. 5A shows a plan view of imaging cell 500, FIG. 5B shows a cross-sectional view taken along line 5B—5B of FIG. 5A, while FIG. 5C shows a cross-sectional view taken along line 5C—5C of FIG. 5A. Imaging cell 500 also represents an example of an imaging cell of the present invention.

As shown in FIGS. 5A–5C, imaging cell 500 includes spaced-apart source and drain regions 514 and 516, respectively, which are formed in a semiconductor material 512 of an opposite conductivity type, such as a well or a substrate, and a channel region 518 which is defined between source and drain regions 514 and 516.

Source and drain regions 514 and 516 can have a number of depths. For example, source and drain regions 514 and 516 can have a depth of one micron, or the depth of the source and drain regions of the adjacent MOS transistors, such as 0.15 microns in a 0.18-micron fabrication process.

FIGS. 5A and 5C illustrate an example of differing depths, where source and drain regions 514 and 516 having a depth of approximately one micron and an adjacent MOS transistor 520 has spaced-apart source and drain regions 522 and 524, respectively, which are formed in semiconductor material 512 to a depth of, for example, 0.15 microns. Regions 522 and 524 have the same conductivity type as regions 514 and 516.

In addition, MOS transistor 520 has a channel region 526 that is defined between source and drain regions 522 and 524, a layer of gate oxide 528 that is formed on material 512, and a gate 530 that is formed on gate oxide layer 528 over channel region 526. As shown in FIGS. 5A and 5C, the depths of source and drain regions 522 and 524 are substantially shallower than the depths of source and drain regions 514 and 516. (Source and drain regions 514 and 516 can alternately have the same depths as source and drain regions 522 and 524 in blue and blue-green light applications.)

In addition, imaging cell 500 includes a layer of gate oxide 532 that is formed over channel region 518, and a floating gate 534 that is formed on gate oxide layer 532 over channel region 518 and the shallow trench isolation region STI. Floating gate 534, which is a conductive region that is electrically isolated from all other conductive regions, can be formed from a layer of patterned polysilicon approximately 2,000 Å thick.

Further, imaging cell 500 includes a layer of interpoly dielectric 540, such as oxide, that is formed on floating gate 534, and a control gate 542 that is formed on interpoly dielectric layer 540. As with layers 244 and 246, layers 532 and 540 can have a number of depths or thicknesses to vary the retention or storage time after electrons have been injected onto floating gate 534.

The operation of imaging cell 500 is performed in the same manner as described with respect to methods 300 and 350, except that light energy is collected in channel region 518, and voltages are placed on control gate 542 of imaging cell 500 rather than the control gate regions of the wells 232 and 434 of imaging cells 200 and 400, respectively.

It should be understood that the above descriptions are examples of the present invention, and that various alternatives of the invention described herein may be employed in practicing the invention. For example, a color imaging cell can be formed from three imaging cells by filtering the light so that one cell captures only blue light, one cell captures only green light, and one cell captures only red light. Thus, it is intended that the following claims define the scope of the invention and that structures and methods within the scope of these claims and their equivalents be covered thereby.

What is claimed is:

1. A semiconductor circuit comprising:
   a MOS transistor having:
      spaced-apart source and drain regions of a first conductivity type that contact a semiconductor region of a second conductivity type, the semiconductor region having a top surface, one of the source and drain regions having a first bottom point that lies furthest away from the top surface, and a first depth measured from the top surface to the first bottom point along a line perpendicular to the top surface;
      a channel region located between the source and drain regions; and a gate formed over, and insulated from, the channel region; and an imaging cell having:

spaced-apart source and drain regions of the first conductivity type that contact the semiconductor region, one of the source and drain regions of the imaging cell having a second bottom point that lies furthest away from the top surface, and a second depth measured from the top surface to the second bottom point along a line perpendicular to the top surface wherein the second depth is substantially larger than the first depth;

a channel region located between the source and drain regions of the imaging cell;

a floating gate formed over, and insulated from, the channel region of the imaging cell; and a control gate well of the first conductivity type, the floating gate being formed over and insulated from the control gate well.

2. The semiconductor circuit of claim 1 and further comprising a layer of oxide formed on the channel region of the imaging circuit and the control gate well, and under the floating gate.

3. The semiconductor circuit of claim 2 wherein the layer of oxide has a thickness that retains electrons for a period of time greater than six months.

4. The semiconductor circuit of claim 1 and further comprising a layer of oxide formed on the channel region of the imaging circuit and the control gate well, and under the floating gate, the layer of oxide having a thickness that retains electrons for a period of time that is greater than zero and less than three seconds.

5. The semiconductor circuit of claim 4 wherein the control gate well is formed in the semiconductor material.

6. The semiconductor circuit of claim 4 and further comprising an intermediate well that contacts the semiconductor material, the control gate well contacting the intermediate well, the intermediate well having an opposite conductivity type as the control gate well and the semiconductor material.

7. The semiconductor circuit of claim 1 wherein the control gate well contacts the semiconductor material.

8. The semiconductor circuit of claim 1 and further comprising an intermediate well that contacts the semiconductor material, the control gate well contacting the intermediate well, the intermediate well having an opposite conductivity type as the control gate well and the semiconductor material.

9. The semiconductor circuit of claim 1 and further comprising a control gate formed over, and insulated from, the floating gate.

* * * * *